United States Patent
Imamura et al.

(10) Patent No.: US 9,224,711 B2
(45) Date of Patent: Dec. 29, 2015

(54) METHOD FOR MANUFACTURING A SEMICONDUCTOR DEVICE HAVING MULTIPLE HEAT SINKS

(71) Applicant: FUJITSU SEMICONDUCTOR LIMITED, Yokohama-shi, Kanagawa (JP)

(72) Inventors: Takeshi Imamura, Akiruno (JP); Nobutaka Shimizu, Machida (JP); Yasunori Fujimoto, Shibata (JP)

(73) Assignee: SOCIONEXT INC., Yokohama (JP)

( * ) Notice: Subject to any disclaimer, the term of this patent is extended or adjusted under 35 U.S.C. 154(b) by 0 days.

(21) Appl. No.: 14/133,859

(22) Filed: Dec. 19, 2013

(65) Prior Publication Data

US 2014/0197533 A1 Jul. 17, 2014

(30) Foreign Application Priority Data

Jan. 15, 2013 (JP) .................. 2013-004465

(51) Int. Cl.
*H01L 21/48* (2006.01)
*H01L 23/36* (2006.01)
(Continued)

(52) U.S. Cl.
CPC .............. *H01L 24/81* (2013.01); *H01L 21/563* (2013.01); *H01L 23/367* (2013.01); *H01L 23/3675* (2013.01); *H01L 23/3736* (2013.01); *H01L 23/42* (2013.01); *H01L 24/83* (2013.01); *H01L 24/92* (2013.01); *H01L 24/13* (2013.01); *H01L 24/16* (2013.01); *H01L 24/27* (2013.01); *H01L 24/29* (2013.01); *H01L 24/32* (2013.01); *H01L 24/73* (2013.01); *H01L 25/16* (2013.01); *H01L 25/18* (2013.01); *H01L 2224/0401* (2013.01); *H01L 2224/04026* (2013.01); *H01L 2224/05575* (2013.01); *H01L 2224/05582* (2013.01); *H01L 2224/05583* (2013.01); *H01L 2224/05644* (2013.01); *H01L 2224/05655* (2013.01); *H01L 2224/05666* (2013.01); *H01L 2224/06181* (2013.01); *H01L 2224/131* (2013.01); *H01L 2224/16225* (2013.01); *H01L 2224/27334* (2013.01); *H01L 2224/291* (2013.01); *H01L 2224/29109* (2013.01); *H01L 2224/29111* (2013.01); *H01L 2224/29191* (2013.01);
(Continued)

(58) Field of Classification Search
CPC . H01L 23/36; H01L 23/3675; H01L 23/3736; H01L 2023/4068
USPC ......................................... 438/122
See application file for complete search history.

(56) References Cited

U.S. PATENT DOCUMENTS 4,696,101 A * 9/1987 Vanzetti et al. ............... 29/740
2004/0118500 A1* 6/2004 Wang .............................. 156/60
(Continued)

FOREIGN PATENT DOCUMENTS

JP 2011-023587 A 2/2011
JP 2011-035352 A 2/2011

*Primary Examiner* — Kevin Parendo
(74) *Attorney, Agent, or Firm* — Westerman, Hattori, Daniels & Adrian, LLP

(57) ABSTRACT

A method for manufacturing a semiconductor device is provided, the method including: mounting a first element on a wiring substrate, placing a first heat sink on the first element with a metal material interposed between the first heat sink and the first element, attaching the first heat sink to the first element via the metal material by heating and melting the metal material, and mounting a second element on the wiring substrate after the steps of attaching the first heat sink to the first element.

11 Claims, 20 Drawing Sheets

(51) Int. Cl.
*H01L 23/367* (2006.01)
*H01L 23/00* (2006.01)
*H01L 23/373* (2006.01)
*H01L 23/42* (2006.01)
*H01L 21/56* (2006.01)
*H01L 25/16* (2006.01)
*H01L 25/18* (2006.01)

(52) U.S. Cl.
CPC ............ *H01L2224/32225* (2013.01); *H01L 2224/32245* (2013.01); *H01L 2224/73204* (2013.01); *H01L 2224/73253* (2013.01); *H01L 2224/81075* (2013.01); *H01L 2224/81815* (2013.01); *H01L 2224/83075* (2013.01); *H01L 2224/83191* (2013.01); *H01L 2224/83447* (2013.01); *H01L 2224/83487* (2013.01); *H01L 2224/83815* (2013.01); *H01L 2224/92125* (2013.01); *H01L 2224/92225* (2013.01); *H01L 2924/01322* (2013.01); *H01L 2924/1432* (2013.01); *H01L 2924/1434* (2013.01); *H01L 2924/15311* (2013.01); *H01L 2924/1659* (2013.01); *H01L 2924/16152* (2013.01); *H01L 2924/16251* (2013.01); *H01L 2924/16747* (2013.01); *H01L 2924/19041* (2013.01); *H01L 2924/19043* (2013.01); *H01L 2924/19105* (2013.01)

(56) References Cited

U.S. PATENT DOCUMENTS

| | | | |
|---|---|---|---|
| 2007/0012477 A1* | 1/2007 | Nakamura et al. | 174/260 |
| 2007/0152322 A1* | 7/2007 | Inomata et al. | 257/706 |
| 2009/0115037 A1* | 5/2009 | How et al. | 257/675 |
| 2010/0019379 A1* | 1/2010 | Zhao et al. | 257/713 |
| 2011/0012255 A1 | 1/2011 | Suganuma | |
| 2011/0308849 A1* | 12/2011 | Kondo et al. | 174/260 |
| 2013/0056861 A1* | 3/2013 | Gao et al. | 257/675 |

* cited by examiner

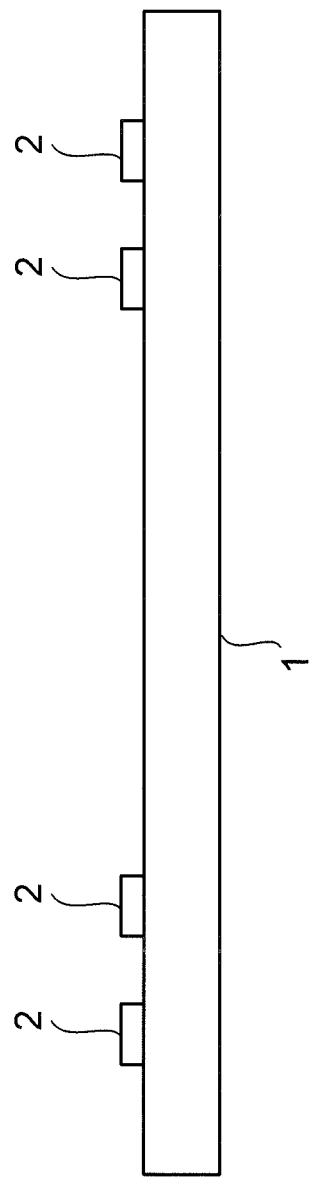
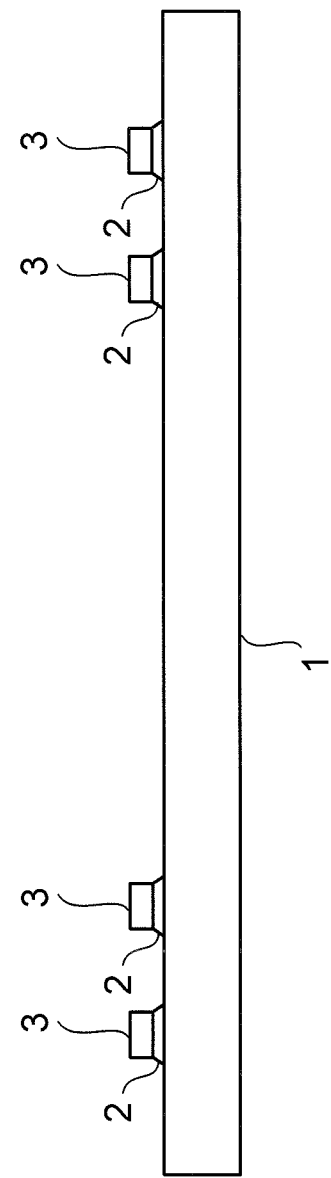

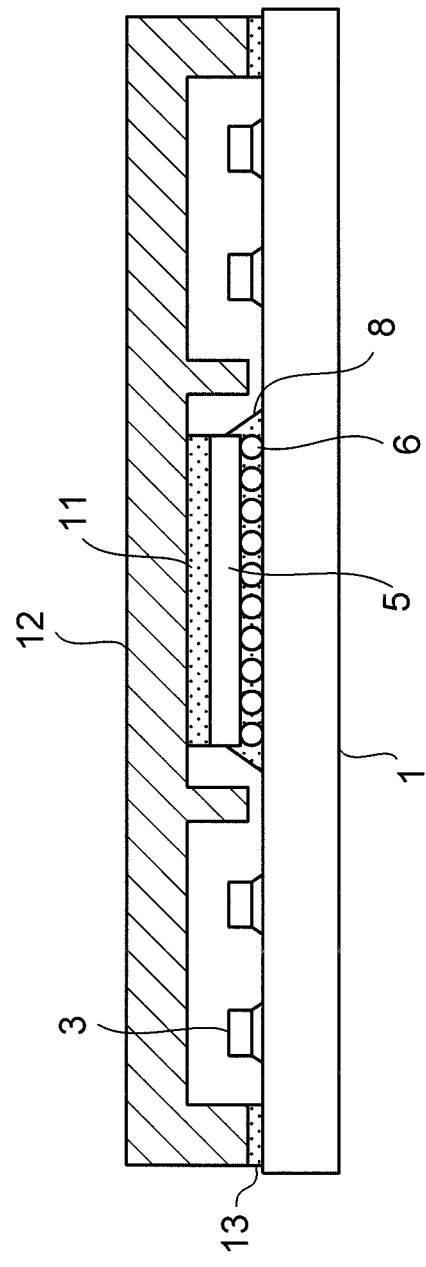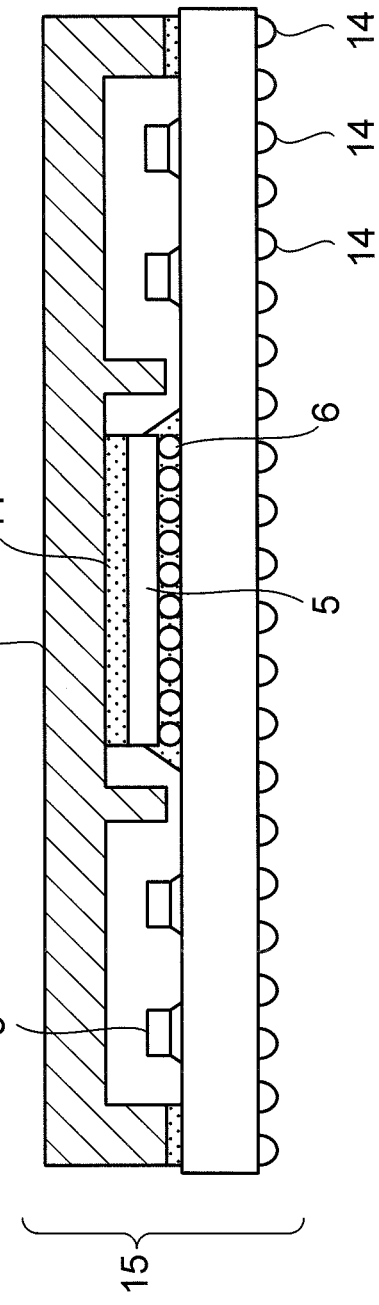

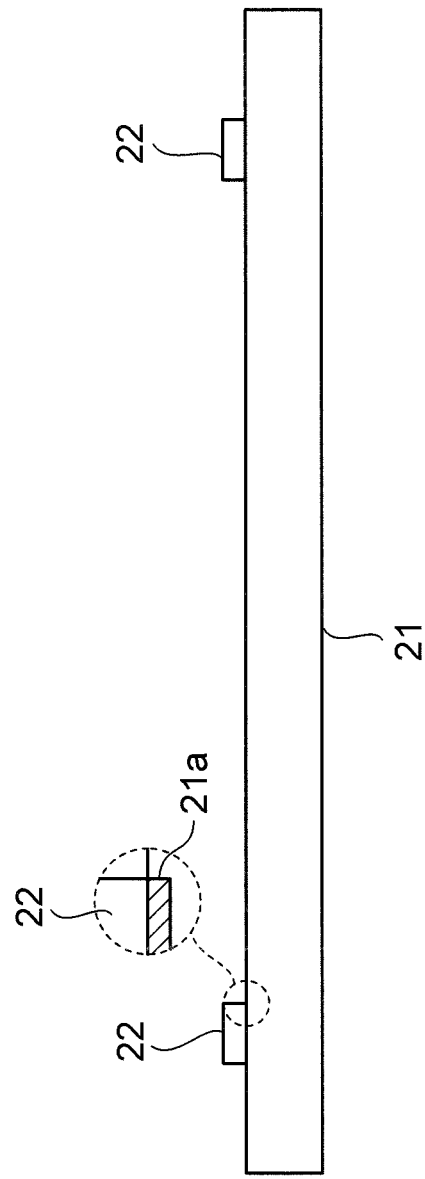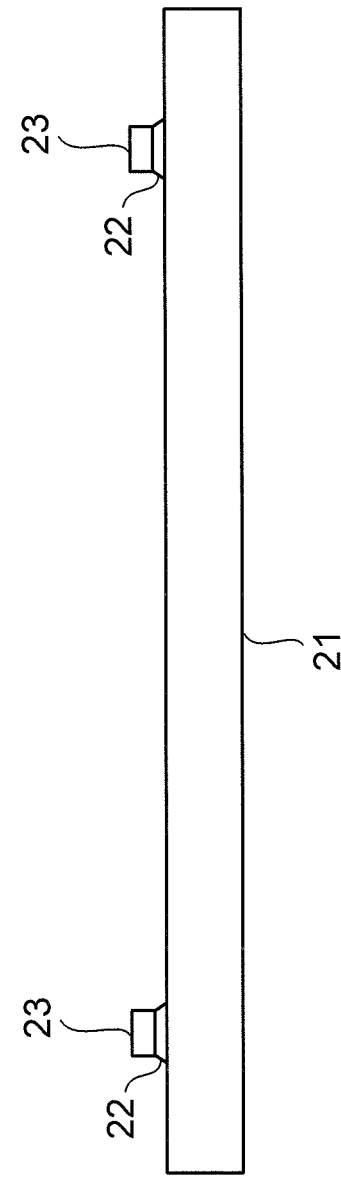
Fig. 2A
Fig. 2B

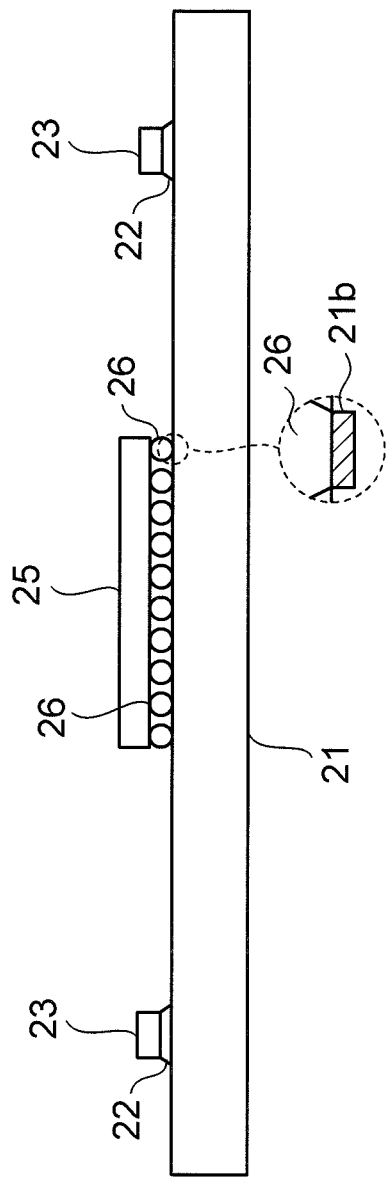
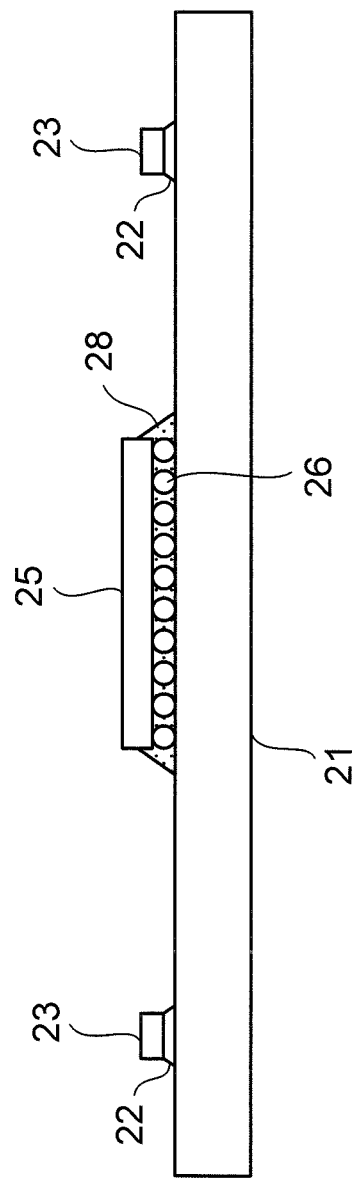

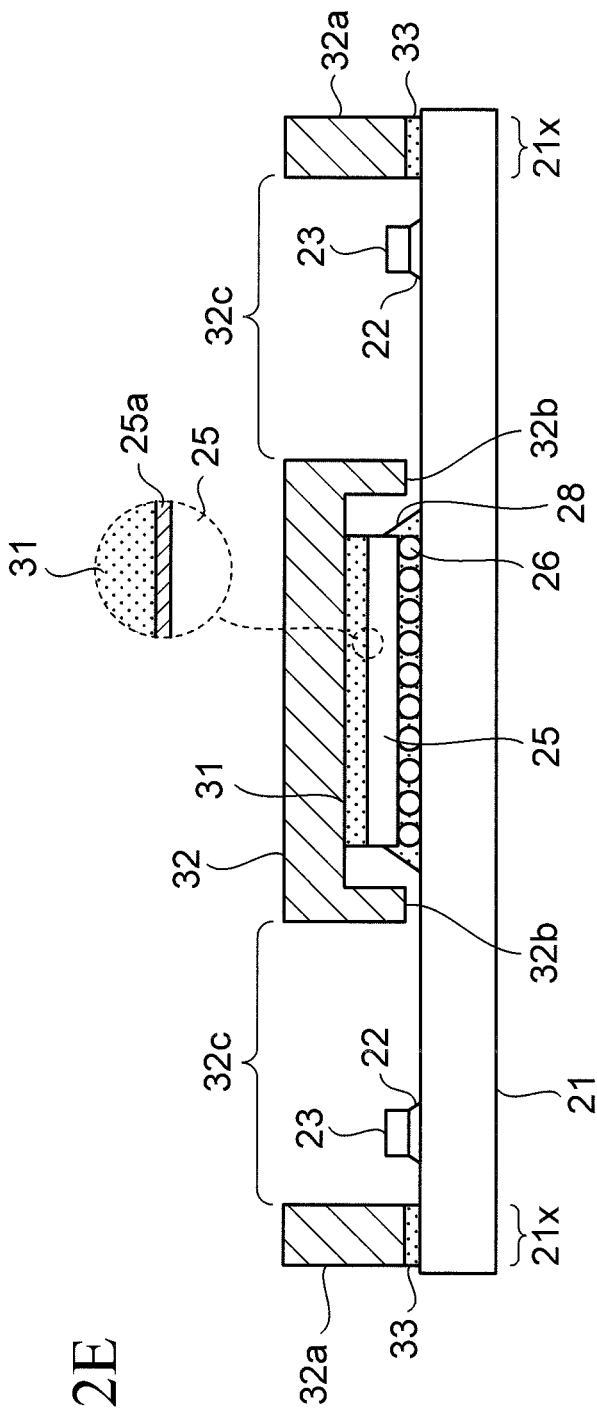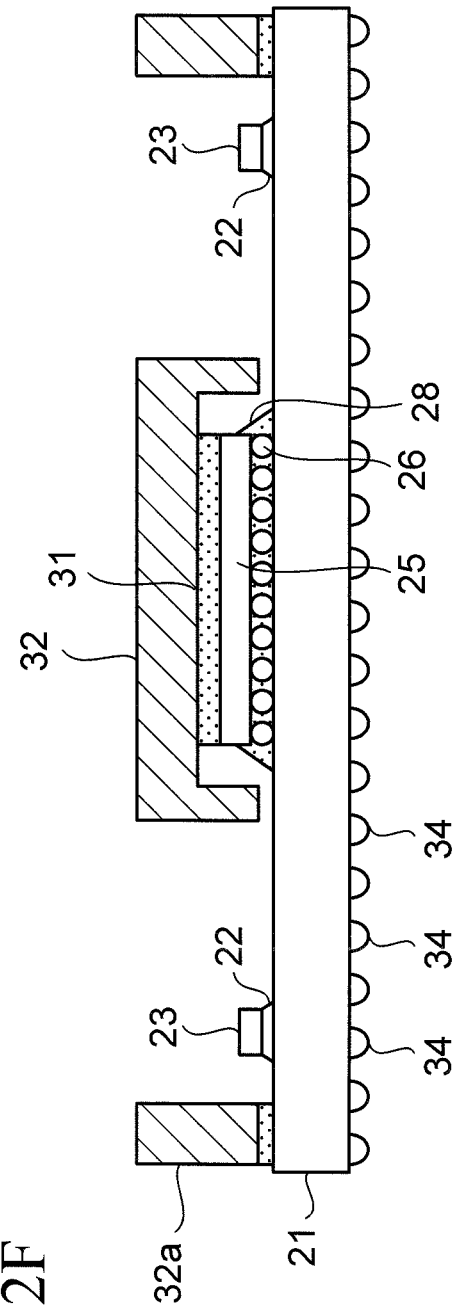

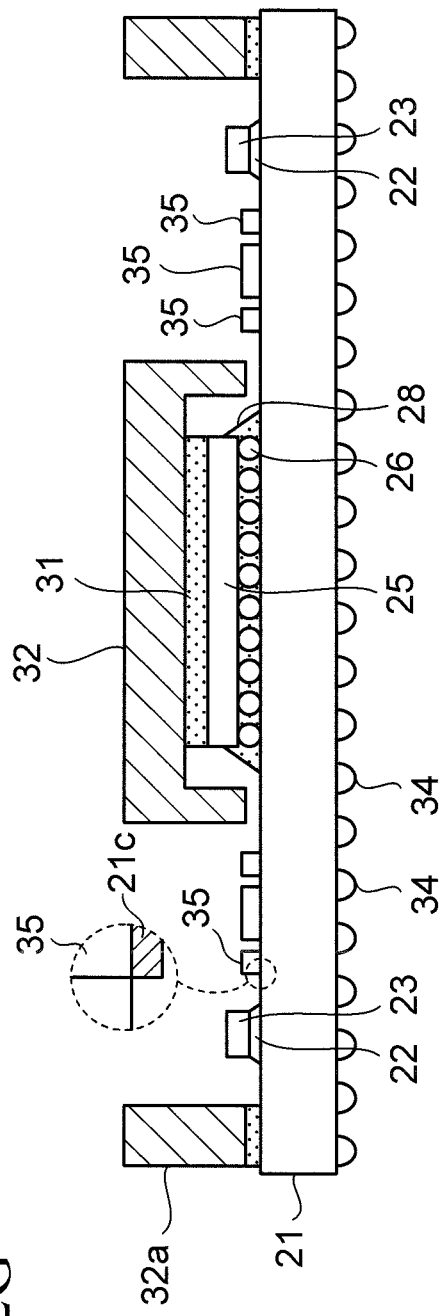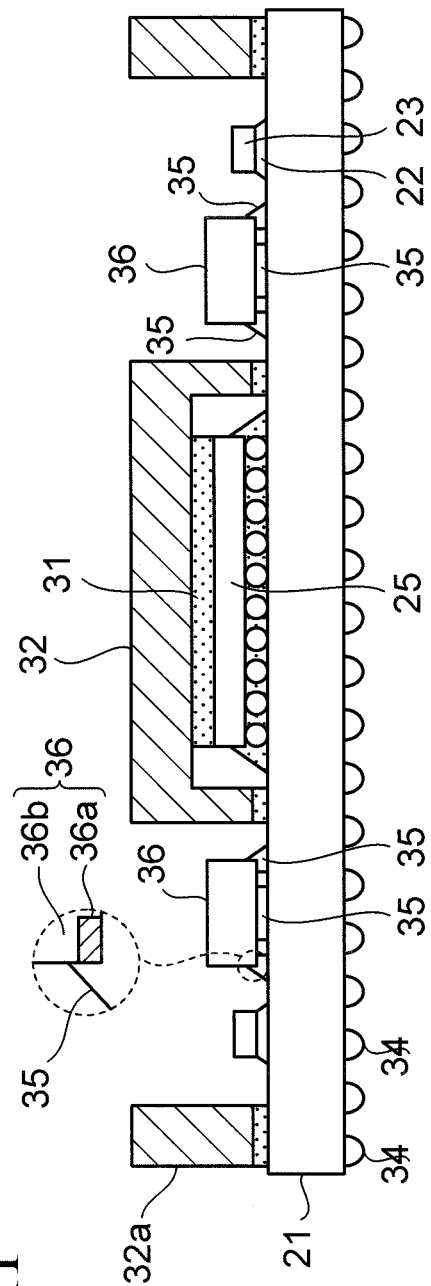

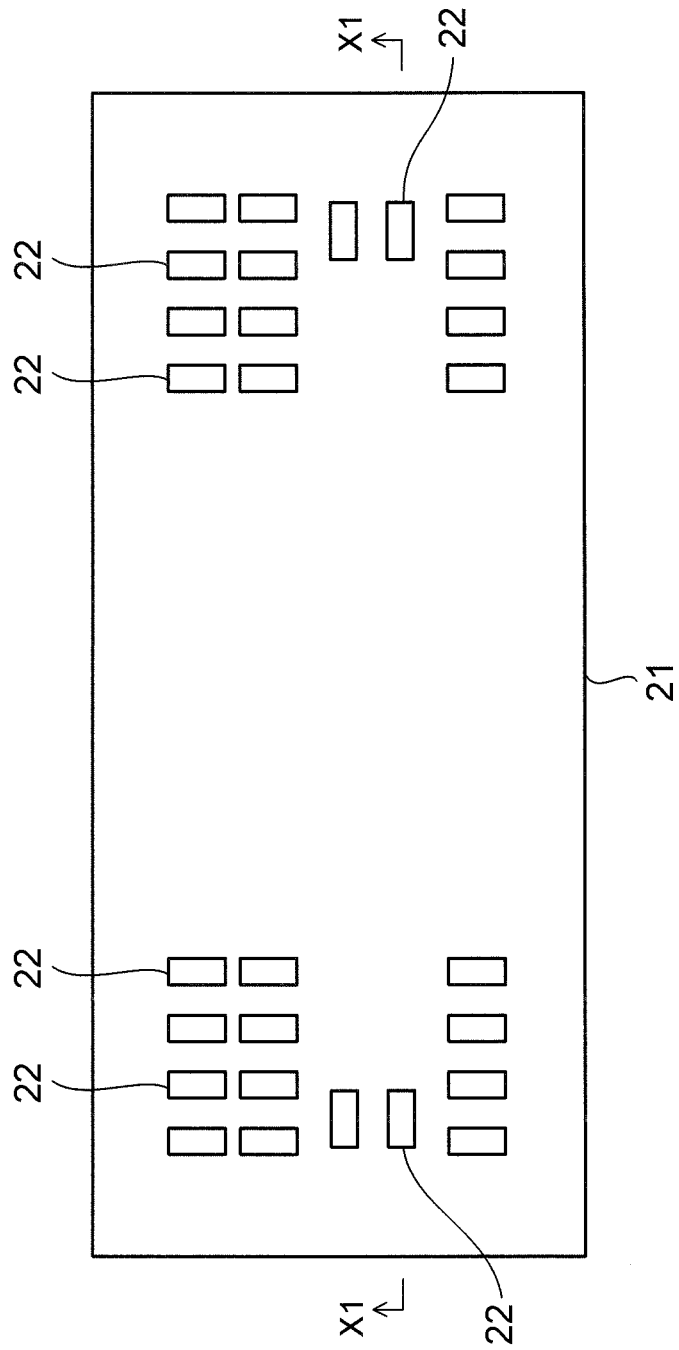

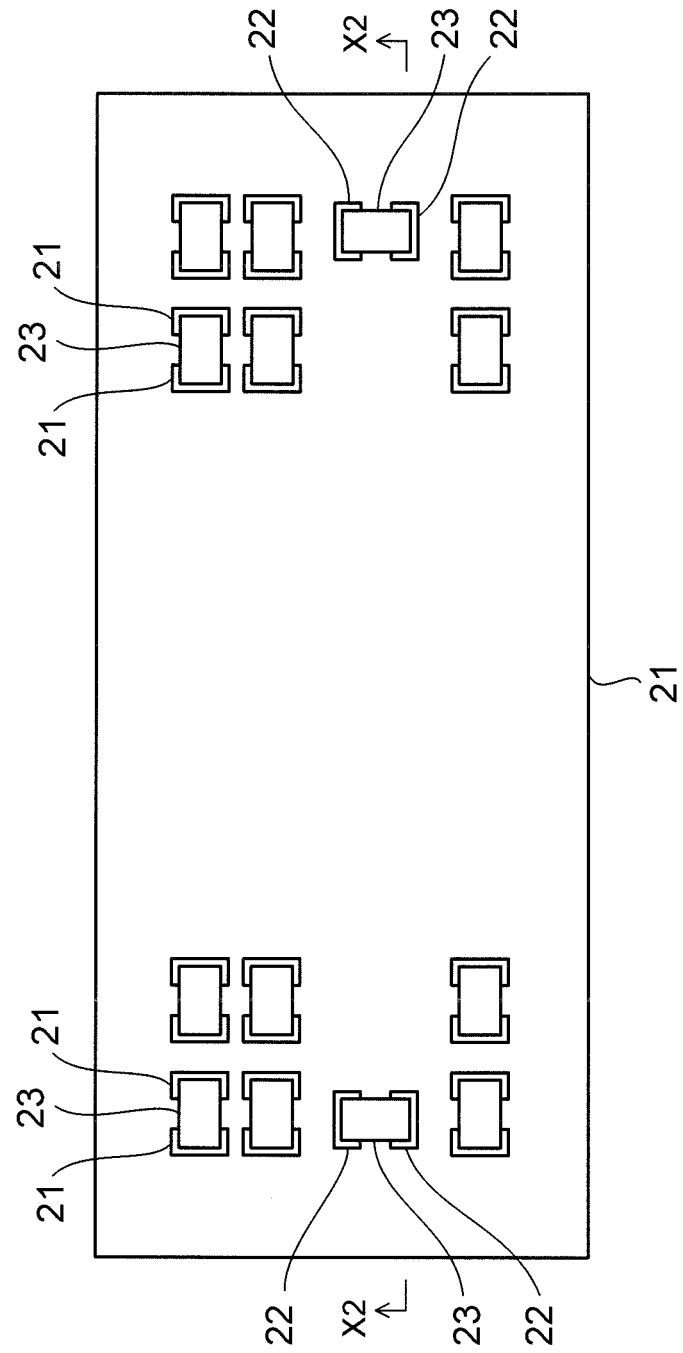

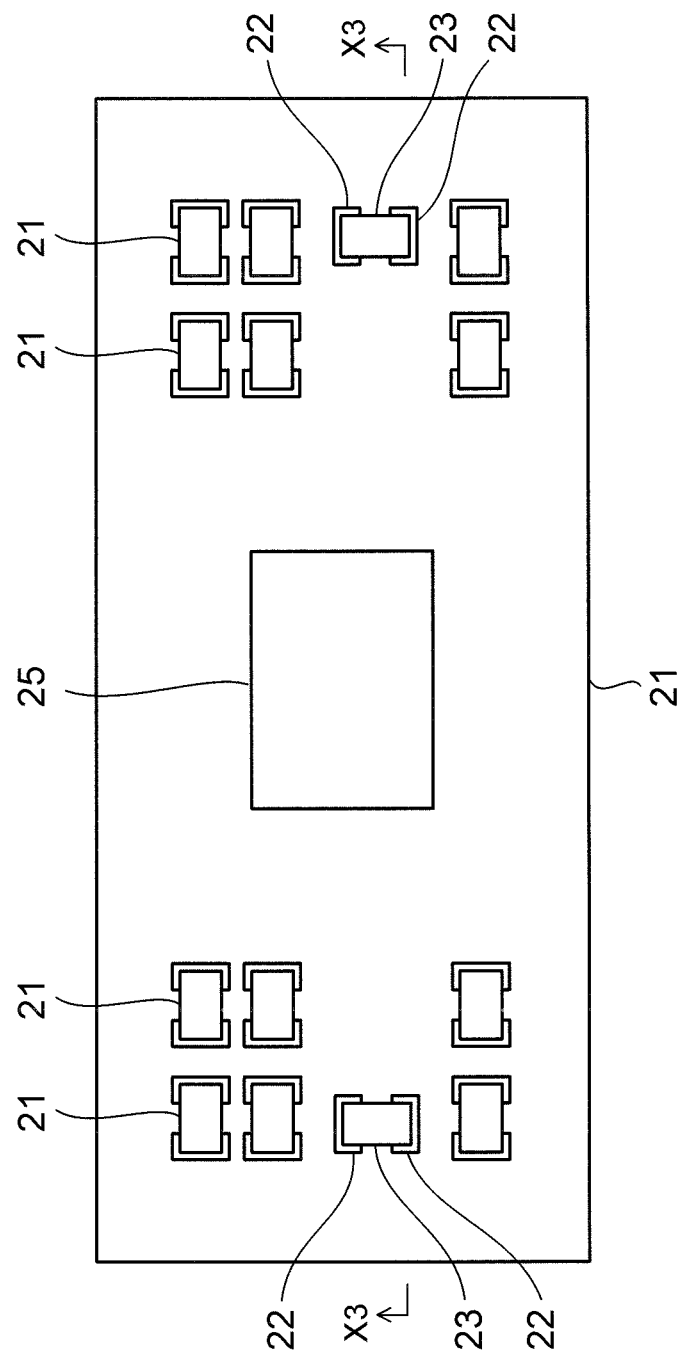

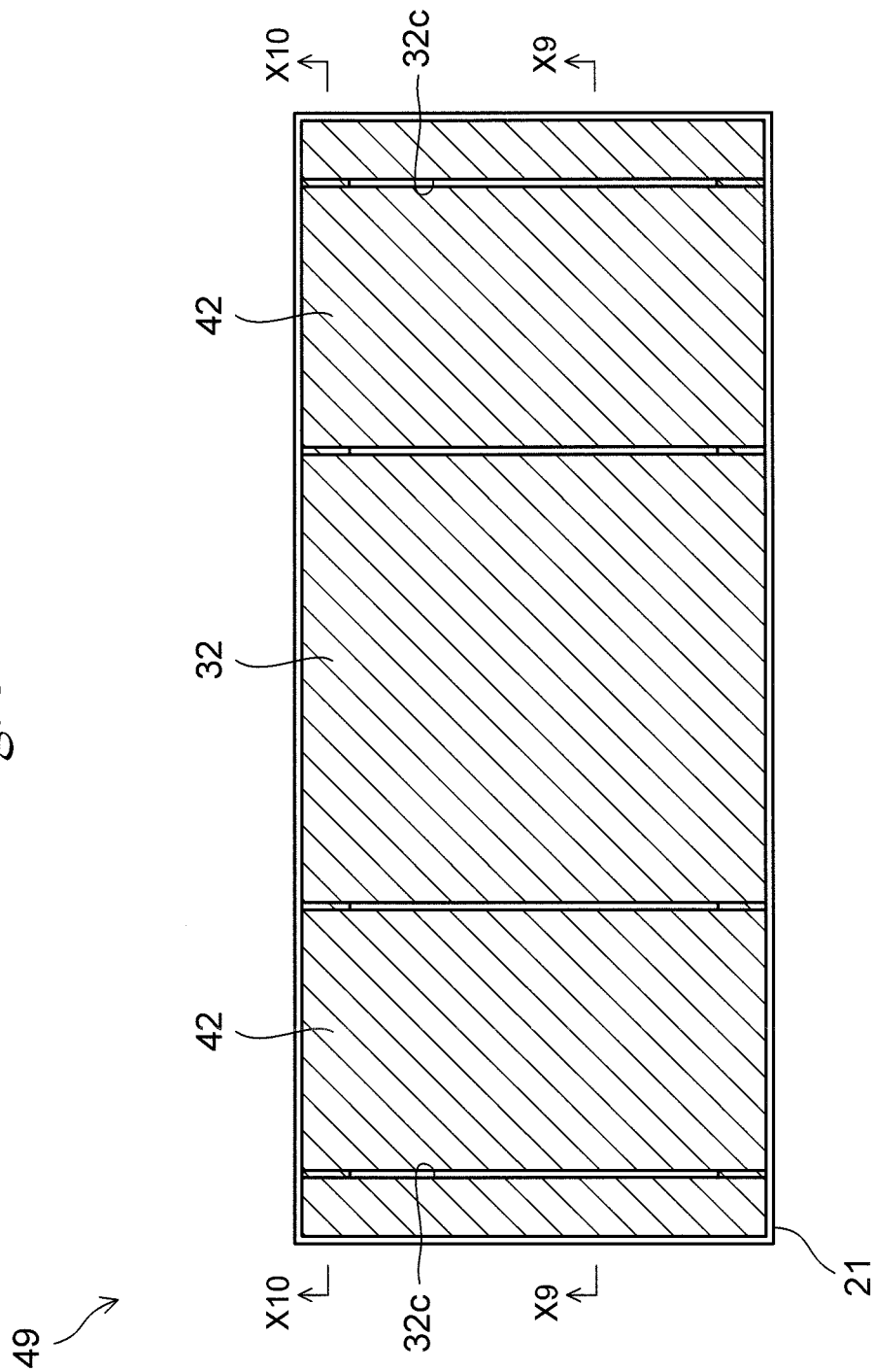

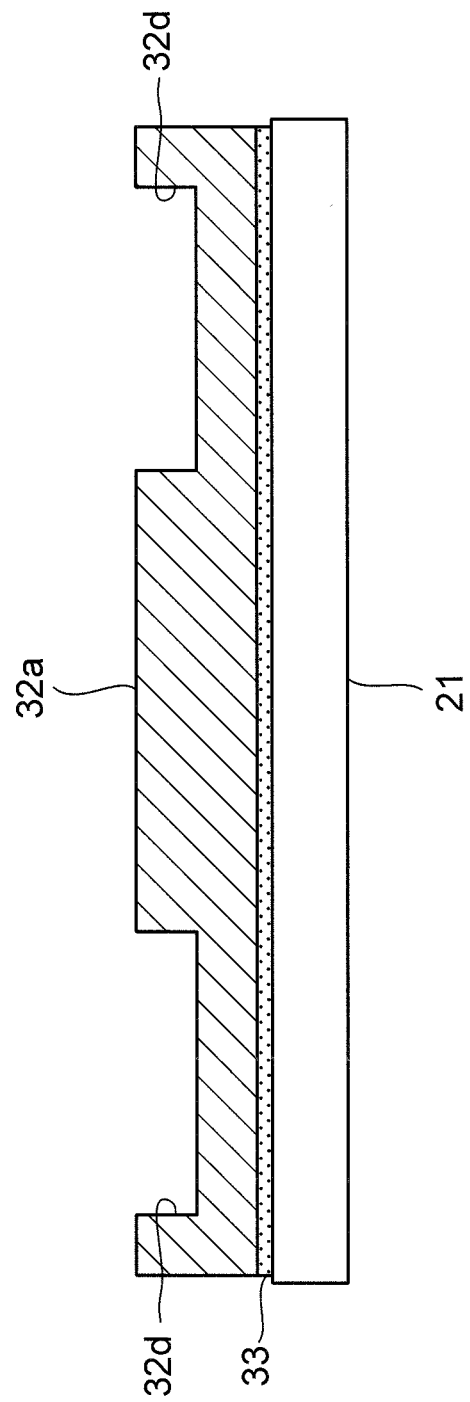

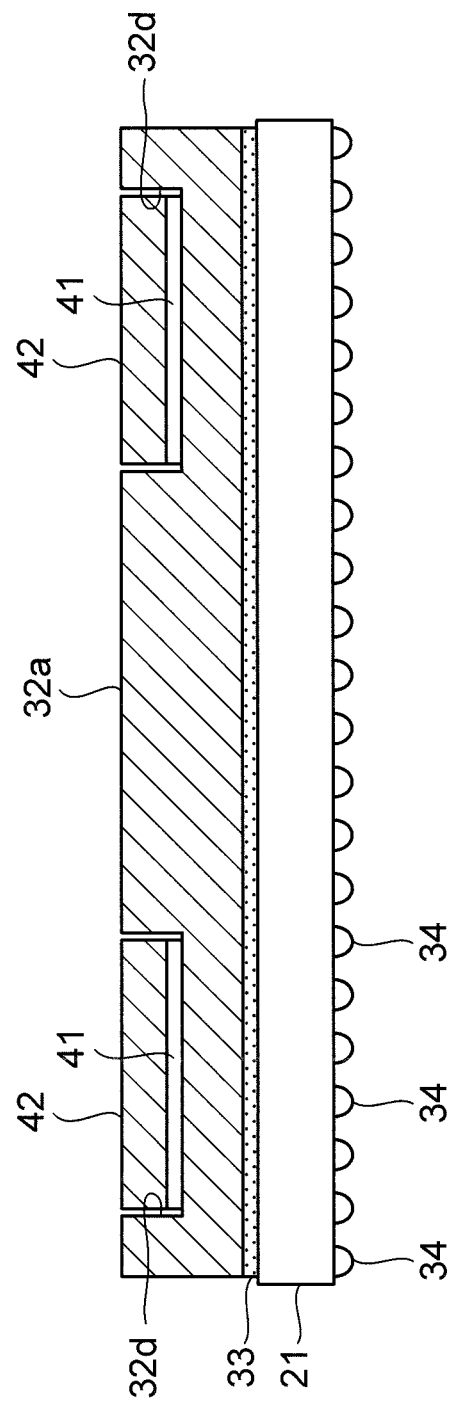

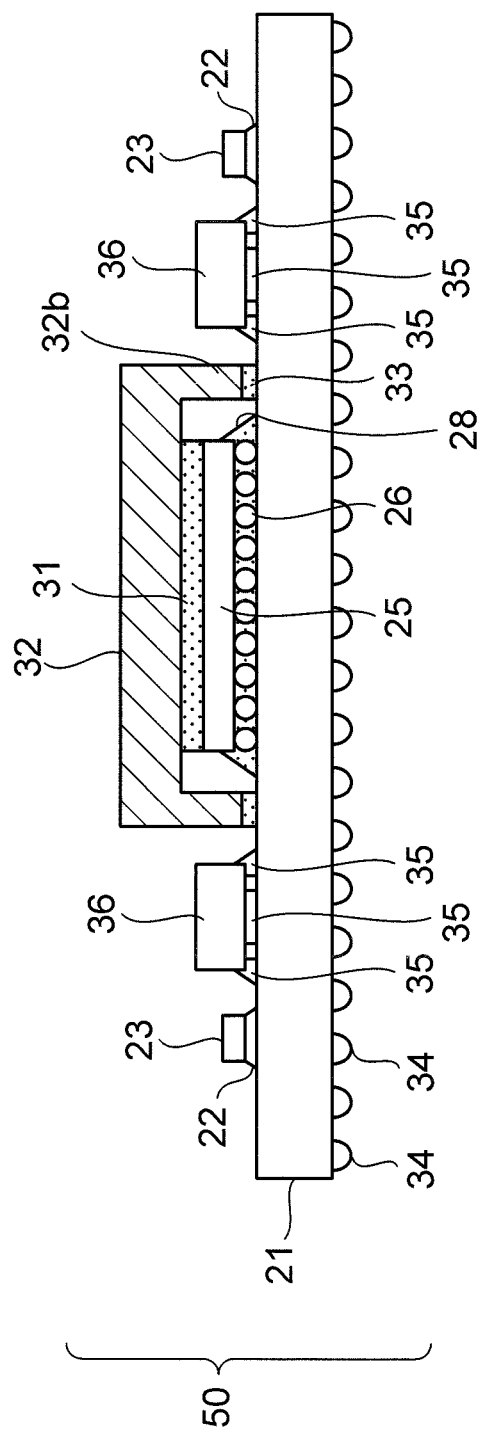

METHOD FOR MANUFACTURING A SEMICONDUCTOR DEVICE HAVING MULTIPLE HEAT SINKS

CROSS-REFERENCE TO RELATED APPLICATION

This application is based upon and claims the benefit of priority of the prior Japanese Patent Application No. 2013-004465, filed on Jan. 15, 2013, the entire contents of which are incorporated herein by reference.

FIELD

The embodiments discussed herein are related to a semiconductor device and a method for manufacturing the semiconductor device.

BACKGROUND

A semiconductor device formed by mounting an element, such as a central processing unit (CPU), on a substrate is used in an electronic device such as a server. An advantageous way to reduce the size and enhance the performance of the electric device is to increase the density of the semiconductor device by mounting elements of different types from the CPU on the same substrate. This shortens the wiring lengths among the elements of multiple types, thus allowing reduction in wiring impedance as well.

However, elements of different types have different properties such as thermal resistance. Hence, mounting these elements on the same substrate without considering their properties might lower the reliability of the final semiconductor device.

Technologies related to the present application are disclosed in Japanese Laid-open Patent Publications Nos. 2011-35352 and 2011-23587.

SUMMARY

According to one aspect discussed herein, there is provided a method for manufacturing a semiconductor device, including mounting a first element on a wiring substrate, placing a first heat sink on the first element with a metal material interposed between the first heat sink and the first element, attaching the first heat sink to the first element via the metal material by heating and melting the metal material, and mounting a second element on the wiring substrate after attaching the first heat sink to the first element.

According to another aspect discussed herein, there is provided a semiconductor device including a wiring substrate, a processing unit mounted on the wiring substrate, a regulator mounted on the wiring substrate, a first heat sink attached into the processing unit via a metal material, and a second heat sink attached to the regulator via a resin material.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF THE DRAWINGS

FIGS. 1A to 1F are cross-sectional views of a semiconductor device in the course of manufacturing studied by the inventors;

FIGS. 2A to 2I are cross-sectional views of a semiconductor device in the course of manufacturing according to an embodiment;

FIGS. 3A to 3H are plan views of the semiconductor device in the course of manufacturing according to the embodiment;

FIG. 4 is a cross-sectional view taken along line X6-X6 in FIG. 3E;

FIG. 5 is a cross-sectional view taken along line X10-X10 in FIG. 3H;

FIG. 7 is a cross-sectional view taken along line X11-X11 in FIG. 6.

DESCRIPTION OF EMBODIMENTS

Figure 1C:
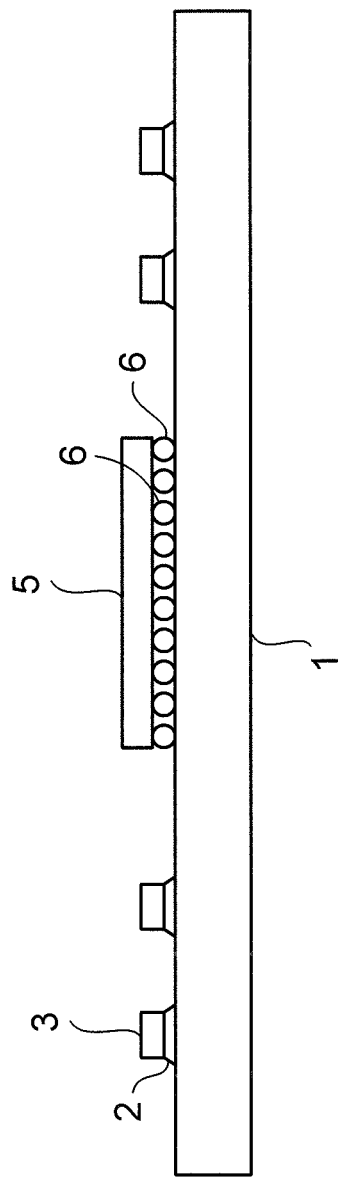

Before an embodiment is described description is given of a semiconductor device studied by the inventors of the present application.

A reflow method is a technique for mounting elements on a wiring substrate. In the reflow method, a metal material such as solder is heated and melted to connect each of the electrodes of the elements to the corresponding electrodes of the wiring substrate mechanically and electrically via the metal material.

FIGS. 1A to 1F are cross-sectional views of a semiconductor device in the course of manufacturing using the reflow method.

First, as depicted in FIG. 1A, a solder paste 2 is printed at predetermined positions on a wiring substrate 1.

Then, as depicted in FIG. 1B, an electronic component 3 is placed on each solder paste 2, and in this state, the paste 2 is melted by reflow. Thereby, the electronic components 3 are connected to the wiring substrate 1 via the solder pastes 2.

Elements usable as the electronic components 3 are, for example, passive elements such as capacitors and resistance elements.

Next, as depicted in FIG. 1C, an element 5 provided with a plurality of solder bumps 6 is placed on the wiring substrate 1. The element 5 is, for example, an active element such as a central processing unit (CPU).

Then, the solder bumps 6 are melted by reflow to connect the element 5 to the wiring substrate 1 via the solder bumps 6.

Figure 1D:
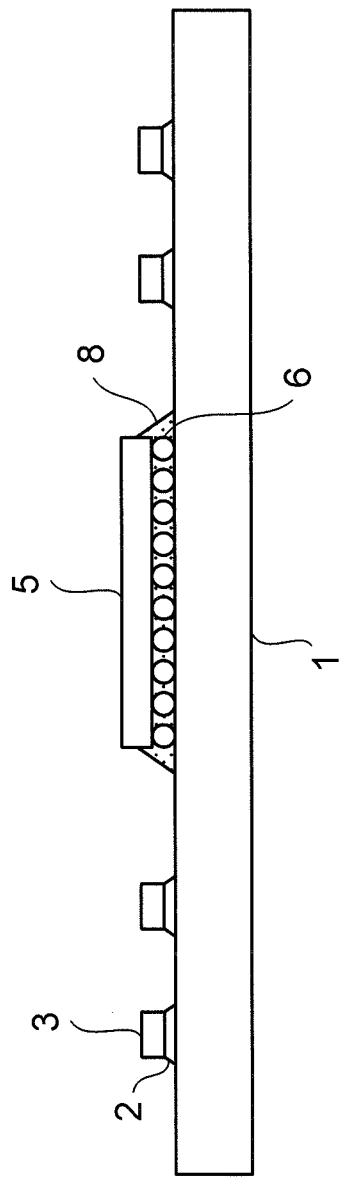

Next, as depicted in FIG. 1D, space between the wiring substrate 1 and the element 5 is filled with an underfill resin 8, and the underfill resin 8 is solidified, reinforcing the connection strength between the wiring substrate 1 and the element 5. The resin usable as the underfill resin 8 is any one of a thermosetting resin and a thermoplastic resin.

Next, as depicted in FIG. 1E, a metal material 11 and a heat sink 12 are placed on the element 5 in this order. Then, the edge of the wring substrate 1 is bonded to the heat sink 12 via an adhesive 13. Here, a solder sheet is used as the metal material 11, and a copper plate is used as the heat sink 12.

Then, in this state, the metal material 11 is melted by reflow, thereby attaching the heat sink 12 to the element 5 via the metal material 11.

The heat sink 12 has a function of releasing heat produced by the element 5 to the outside, and using copper or the like having good thermal conductivity as the heat sink 12 enhances the heat releasing effect of the heat sink 12.

In particular, in this example, the metal material 11 having higher thermal conductivity than other materials such as a resin is used as the material for attaching the heat sink 12 to the element 5. This makes heat flow smoothly from the element 5 to the heat sink 12 and therefore enhances the heat releasing effect by the heat sink 12."

Thereafter, as depicted in FIG. 1F, as external connection terminals 14, a plurality of solder bumps are bonded to a surface of the wiring substrate 1, where the surface being opposite from the side where the heat sink 12 is provided. Thus, the basic structure of a ball grid array (BGA) semiconductor device 15 is completed.

Although the semiconductor device 15 is provided with only one active element such as a CPU as the element 5, it is effective to mount active elements of different types from the element 5 on the wiring substrate 1 in order to enhance the performance of the semiconductor device 15.

Other than a CPU, an active element which may be mounted on the wiring substrate 1 is, for example, a regulator. A regulator is an element configured to output constant voltage by smoothing direct current voltage. When the regulator is mounted on the wiring substrate 1, the wiring length between the regulator and the element 5 is shortened. Thus, it is expected that wiring impedance is reduced, thereby enhancing the performance of the semiconductor device 15.

However, an active element such as a regulator might be damaged by the heat applied in the reflow, and this might lower the reliability of the active element. The damage includes, for example, a phenomenon in which a sealing resin of the element is peeled off from an electrode of the element due to the difference in coefficient of expansion between the sealing resin and the electrode of the element.

The reliability falls more noticeable as the number of times of the reflow increase. Thus, some manufacturers of elements define an upper limit for the number of reflows and recommend that the reflow be performed the upper-limit number of times or less so as to guarantee the reliability of the elements.

In this example, the metal material 11 is subjected to reflow in the above-described step in FIG. 1F. Thus, if the regulator is mounted on the wiring substrate 1 together with the element 5, the remaining number of reflows allowed for the regulator is decreased by one. This may pose a risk that the regulator is subjected to reflow more than the upper-limit number of times before the semiconductor device 15 is completed. Hence, it is difficult to mount the regulator on the wiring substrate 1 together with the element 5 while maintaining the reliability of the regulator.

Moreover, it is preferable that the heat sink 12 be attached to the regulator as well to promote heat release. However, since the regulator consumes less power and produces less heat than a CPU and the like, the material for connecting the heat sink 12 to the regulator does not necessarily have to be the metal material 11 having good thermal conductivity. However, it is not easy to attach the element 5 such as a CPU to the heat sink 12 with the metal material 11, and to attach the regulator to the heat sink 12 with a material other than the metal material 11.

The embodiment is described below.

Embodiment

FIGS. 2A to 2I are cross-sectional views of a semiconductor device in the course of manufacturing according to the embodiment, and FIGS. 3A to 3H are corresponding plan views.

In the embodiment, elements of different types are mounted on a single wiring substrate in the following manner.

First, as depicted in FIG. 2A, a first solder paste 22 is printed on each first electrode 21a of a wiring substrate 21. The first solder paste 22 may instead be applied to the first electrode 21a with a dispenser.

Examples of a material for the first solder paste 22 include a Sn—Pb eutectic solder that melts at about 183° C., and a lead-free, Sn—Ag based solder, such as a Sn—Ag—Cu solder that melts at about 220° C.

FIG. 3A is a plan view illustrating a state after this step, and FIG. 2A referred to above is a cross-sectional view taken along line X1-X1 in FIG. 3A.

As depicted in FIG. 3A, the first solder paste 22 is applied to the wiring substrate 21 at predetermined intervals.

Next, as depicted in FIG. 2B, electronic components 23 are placed on the first solder pastes 22. Then, in this state, the first solder pastes 22 are heated by the reflow method and are thus melted to connect the electronic components 23 to the wiring substrate 21 via the first solder pastes 22. The reflow method is performed, for example, in a nitrogen atmosphere at a substrate temperature of 245° C. to 250° C.

Further, the electronic components 23 are not particularly limited, but are passive elements such as capacitors and resistance elements in this embodiment.

FIG. 3B is a plan view illustrating a state after this step, and FIG. 2B referred to above is a cross-sectional view taken along line X2-X2 in FIG. 3B.

As depicted in FIG. 3B, each electronic component 23 is rectangular in a plan view, and is connected at both ends to the wiring substrate 21 with the first solder pastes 22.

Next, as depicted in FIG. 2C, a first element 25 provided with a plurality of solder bumps 26 is prepared, and is placed on the wiring substrate 21 after adjusting the positions of the solder bumps 26 with the respective second electrodes 21b of the wiring substrate 21.

The first element 25 is an active element. For example, a processing unit such as a CPU, a graphical processing unit (CPU), or a micro processing unit (MPU) may be used as the first element 25.

Then, the first element 25 is mounted on the wiring substrate 21 by heating and melting the solder bumps 26 by the reflow method. In the embodiment, the reflow is performed in a nitrogen atmosphere at a substrate temperature of 245° C. to 250° C.

FIG. 3C is a plan view illustrating a state after this step, and FIG. 2C referred to above is a cross-sectional view taken along line X3-X3 in FIG. 3C.

As depicted in FIG. 3C, the first element 25 is rectangular in plan view, and is mounted near the center of the wiring substrate 21.

Then, as depicted in FIG. 2D, a space between the wiring substrate 21 and the first element 25 is filled with an underfill resin 28, and the underfill resin 28 is then solidified, thereby reinforcing the connection strength between the wiring substrate 21 and the first element 25. Examples of the underfill resin 28 include a thermosetting resin and a thermoplastic resin.

Figure 2I:
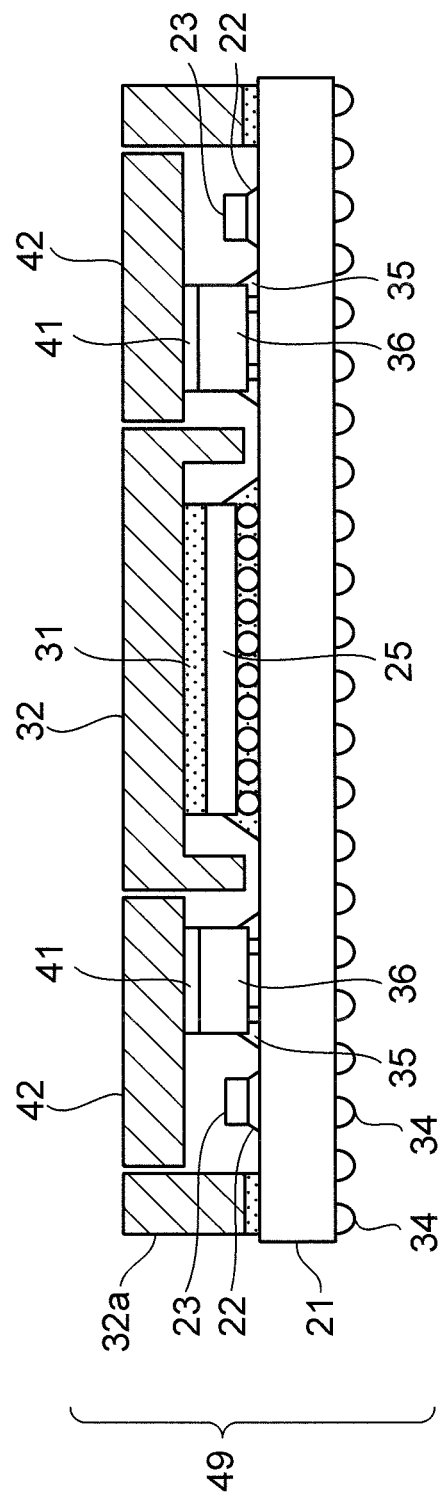
Figure 3D:
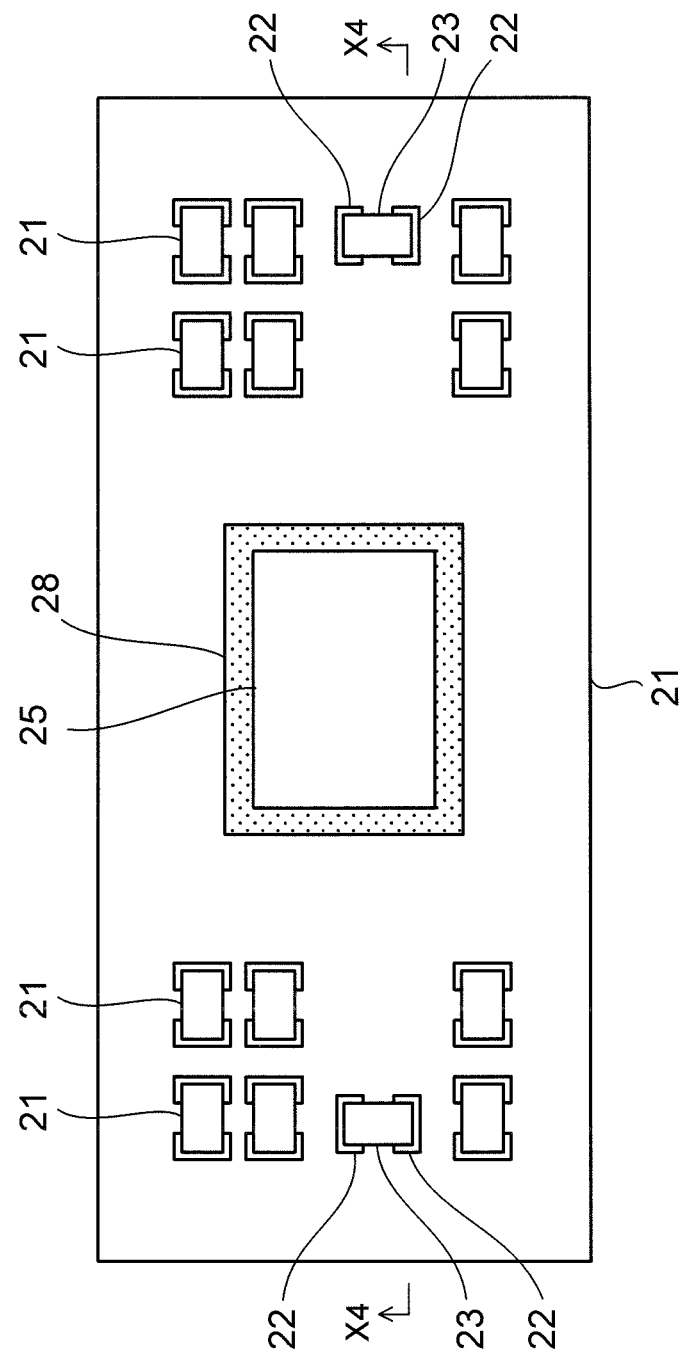

FIG. 3D is a plan view illustrating a state after this step, and FIG. 2D referred to above is a cross-sectional view taken along line X4-X4 in FIG. 3D.

Next, as depicted in FIG. 2E, a metal material 31 and a first heat sink 32 are placed on the first element 25 in this order.

Materials for the metal material 31 and the first heat sink 32 are not particularly limited. In the embodiment, a solder sheet made of an In—Ag based solder that melts at about 140° C. is used as the metal material 31, and a copper plate is used as the first heat sink 32.

Alternatively, a solder sheet made of a Sn—Pb based solder may be used as the metal material 31, and a ceramic plate made of aluminum silicon carbide having good thermal conductivity may be used as the first heat sink 32 instead of the copper plate.

The first heat sink 32 is provided with protrusions 32b at portions next to the first element 25, the protrusions 32b protruding from a surface of the first heat sink 32 to a point close to the wiring substrate 21.

Then, in this state, the metal material 31 is heated and melted by the reflow method, thereby attaching the first heat sink 32 to the first element 25 via the metal material 31. For example, the reflow may be performed in a nitrogen atmosphere at a substrate temperature of about 245° C. to 250° C.

Even if the metal material 31 is thus melted, the protrusions 32b of the first heat sink 32 block the flow of the melted metal material 31. Therefore, the plurality of electronic components 23 is prevented from being electrically connected to each other via the metal material 31.

A metal layer 25a may be formed on the first element 25 in advance to improve the wettability of the metal material 31 on the first element 25 and to thereby increase the bonding strength between the first element 25 and the metal material 31. As the metal layer 25a, for example, a laminated film formed by stacking a titanium film and a gold film in this order or a laminated film formed by stacking a titanium film, a nickel film, and a gold film in this order may be formed.

Figure 3E:
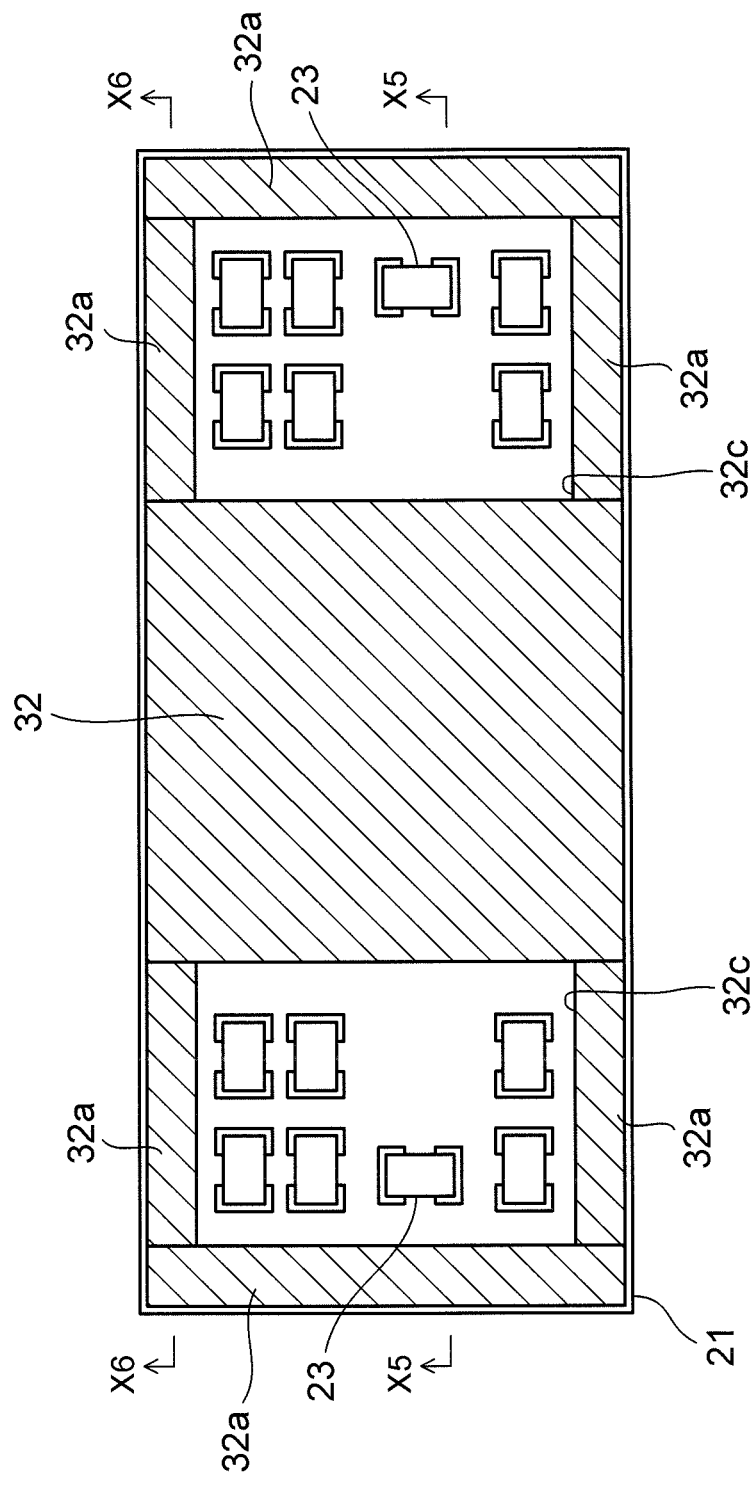

FIG. 3E is a plan view illustrating a state after this step, and FIG. 2E referred to above is a cross-sectional view taken along line X5-X5 in FIG. 3E.

As depicted in FIG. 3E, the first heat sink 32 has a frame 32a provided along an edge of the wiring substrate 21 in a plan view and has two openings 32C inside the frame 32a.

The frame 32a is bonded to an edge 21x of the wiring substrate 21 with an adhesive 33 (see FIG. 2E) in this step, and functions as a stiffener preventing warpage of the wiring substrate 21.

FIG. 4 is a cross-sectional view along line X6-X6 in FIG. 3E, and depicts a section of the frame 32a running along the edge of the wiring substrate 21.

As depicted in FIG. 4, the frame 32a has two recessed portions 32d which are communicated to the respective openings 32c.

Next, as depicted in FIG. 2F, a plurality of solder bumps are placed as external connection terminals 34 on a surface of the wiring substrate 21, where the surface being opposite from the side where the first heat sink 32 is provided. Then, in this state, the external connection terminals 34 are heated and melted by the reflow method and thereby connected to the wiring substrate 21.

Reflow conditions in this step are not particularly limited. In this embodiment, a Sn—Ag—Cu solder that melts at about 220° C. is used as a material for the external connection terminals 34, and the reflow is performed in a nitrogen atmosphere at a substrate temperature of about 245° C. to 250° C.

Next, as depicted in FIG. 2G, a second solder paste 35 is printed on each third electrode 21c of the wiring substrate 21. The second solder paste 35 may be applied with a dispenser.

A material for the second solder paste 35 is not particularly limited. In the embodiment, like the first solder paste 22, a Sn—Pb eutectic solder that melts at about 183° C. is used as a material for the second solder paste 35. In place of the Sn—Pb eutectic solder, a Sn—Ag—Cu solder that melts at about 220° C. may also be used.

The second solder pastes 35 may be printed at the same time that the first solder pastes 22 in the above-described step in FIG. 2A are printed. However, to prevent the second solder paste 35 from wetting and spreading due to the heat applied in steps such as the step of mounting the electronic components 23 (see FIG. 2B), it is preferable that the second solder pastes 35 are printed after the first solder pastes 22 are printed, as in the embodiment.

Figure 3F:
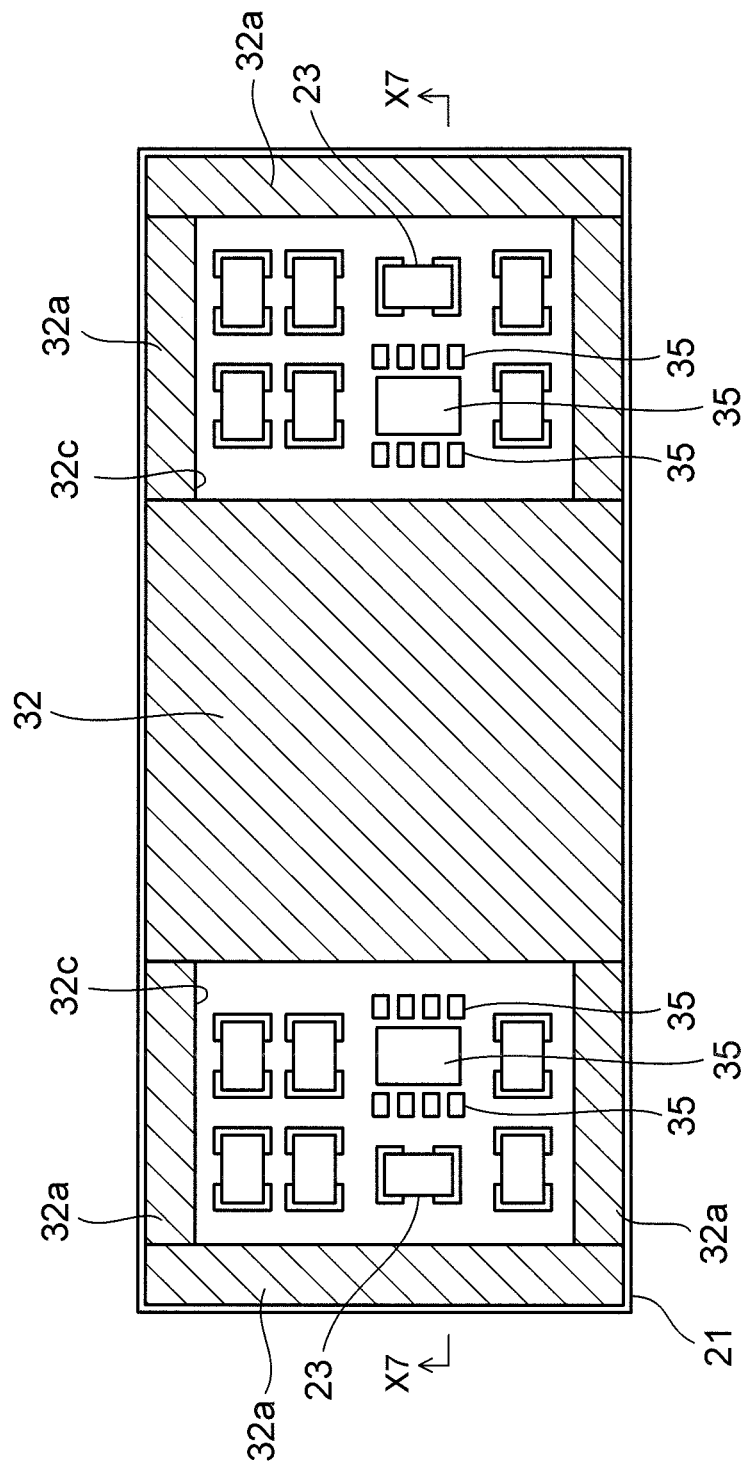

FIG. 3F is a plan view illustrating a state after this step, and FIG. 2G referred to above is a cross-sectional view taken along line X7-X7 in FIG. 3F.

Next, as depicted in FIG. 2H, the second elements 36 are placed on the second solder pastes 35. Then, in this state, the second solder pastes 35 are heated and melted by the reflow method, and thereby the second elements 36 are mounted on the wiring substrate 21 via the second solder pastes 35.

The reflow may be performed in a nitrogen atmosphere at a substrate temperature of about 245° C. to 250° C., for example.

Each second element 36 has electrodes 36a and a sealing resin 36b, and the electrodes 36a are electrically connected to the second solder pastes 35 by the above reflow.

Further, the second element 36 is an active element of a type different from the first element 25, and may be, for example, a regulator, a memory, or the like.

As described earlier, when an active element such as a regulator is subjected to reflow repeatedly, the reliability of the active element might be lowered because, for example, the sealing resin 36b might peel off from the electrode 36a. For this reason, in order to guarantee the reliability of the second element 36, some manufacturers define an upper limit for the number of times of reflows on the second element 36, and it is preferable to perform reflow without exceeding the upper-limit.

Note that such a restriction on the number of times of reflows is intended for such a reflow that is heated to a temperature equal to or higher than the substrate temperature (245° C. to 250° C.) at which the second elements 36 are mounted in this step, and the second element 36 is not damaged by a temperature lower than this. Therefore, in the embodiment, the second elements 36 are maintained at a temperature lower than the substrate temperature (245° C. to 250° C.) after this step until a semiconductor device is completed, so that the reliability of the second elements 36 is not lowered.

Figure 3G:
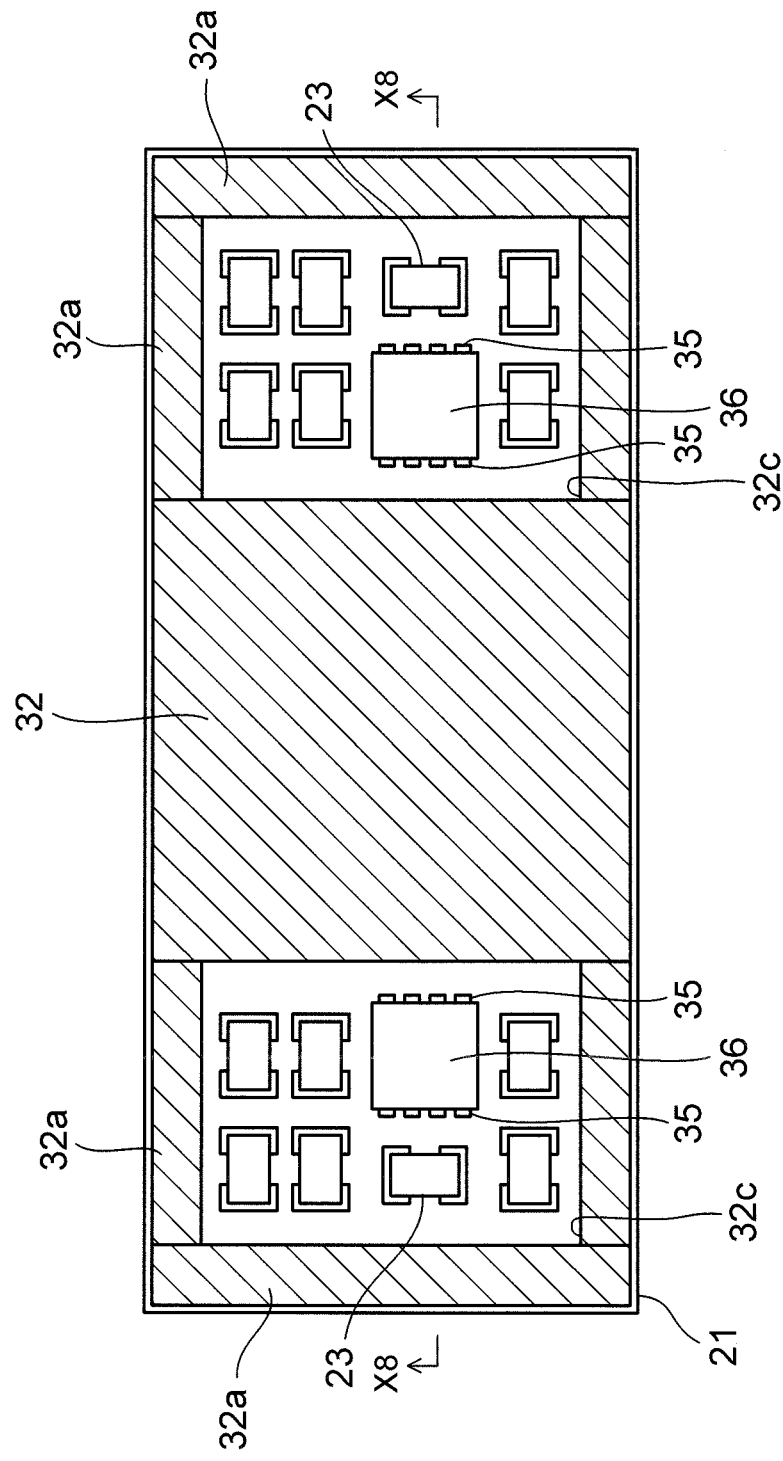

FIG. 3G is a plan view illustrating a state after this step, and FIG. 2H referred to above is a cross-sectional view along line X8-X8 in FIG. 3G.

As depicted in FIG. 3G, each opening 32c of the first heat sink 32 has such a size as to include the second element 36 in plan view, and the second element 36 is exposed in the opening 32c.

Subsequently, as depicted in FIG. 2I, a second heat sink 42 is placed on each second element 36 via a thermosetting resin material 41. Then, in this state, the resin material 41 is heated and cured, thereby attaching the second heat sink 42 to the second element 36 via the resin material 41.

The resin material 41 is not particularly limited, but is preferably a resin having a thermal curing temperature lower than the melting point of the metal material 31 so that damage to the second element 36 is reduced in thermal curing.

In this case, the temperature for heating the resin material 41 can be set to be lower than the melting point of the metal material 31, and in this embodiment, the resin material 41 is cured at a substrate temperature of about 150° C. This level of temperature gives almost no damage to the second elements 36, and this step does not decrease the remaining number of reflows allowed for the second elements 36.

The second heat sink 42 is to release heat produced by the second element 36 to the outside, and like the first heat sink 32, may be a copper plate or a ceramic plate made of aluminum silicon carbide or the like.

A material for the resin material 41 is not particularly limited either. In order that heat may speedily move from the second element 36 to the second heat sink 42, silicone resin having good thermal conductivity is preferable for the resin material 41.

A regulator or the like used as the second element 36 consumes less power and produces less heat than the first element 25 such as a processing unit. Hence, sufficient heat releasing effect is obtained even if the resin material 41 having lower thermal conductivity than the thermal conductivity of the metal material 31 is used.

FIG. 3H is a plan view illustrating a state after this step, and FIG. 2I referred to above is a crass-sectional view taken along line X9-X9 in FIG. 3H.

As depicted in FIG. 3H, each second heat sink 42 is rectangular in plan view, and covers each of the openings 32c of the first heat sink 32.

FIG. 5 is a cross-sectional view taken along line X10-X10 in FIG. 3H.

As depicted in FIG. 5, in this step, the second heat sinks 42 are bonded to the corresponding recessed portions 32d by the above-described resin material 41, and are thereby stably supported by the frame 32a.

With the above, the basic structure of a semiconductor device 49 according to this embodiment is completed.

According to the embodiment described above, after the first heat sink 32 is fixed to the first element 25 in the step in FIG. 2E, the second elements 36 are mounted on the wiring substrate 21 in the step in FIG. 2H.

According to this, the second elements 36 are not exposed to the heat applied in performing reflow on the metal material 31 in the step in FIG. 2E. Consequently, even in a case where an upper limit is defined for the number of reflows performed on the second element 36 in order to guarantee the reliability of the second element 36, there is less possibility that the number of reflows performed on the second element 36 exceeds the upper limit before the semiconductor device 49 is completed. Thus, the first element 25 and the second elements 36 of a different type from the first element 25 can be mounted on the wiring substrate 21 while the reliability of the second elements 36 is maintained. The performance of the semiconductor device 49 can therefore be enhanced.

Although reflow is performed in the step of connecting the external connection terminals 34 to the wiring substrate 21 (see FIG. 2F) and the step of mounting the electronic components 36 on the wiring substrate 21 (see FIG. 2H), the second elements 36 are mounted on the wiring substrate 21 after these steps in this embodiment. Hence, the second elements 36 are not exposed to the heat applied in the reflow, and it is prevented that the remaining number of times of reflows allowed for the second elements 36 is decreased by these steps.

Moreover, in the step in FIG. 2I, the second heat sinks 42 are attached to the second elements 36 with the resin material 41 which does not require any reflow. Thus, the number of times of reflows allowed for the second elements 36 is not wastefully consumed by this step.

Further, using the second heat sinks 42 aside from the first heat sink 32 makes it easy to attach the first element 25 to the first heat sink 32 with the metal material 31 and to attach the second elements 36 to the second heat sinks 42 with the resin material 41.

The embodiment is described in detail above, but the embodiment is not limited to what is described above.

Figure 6:
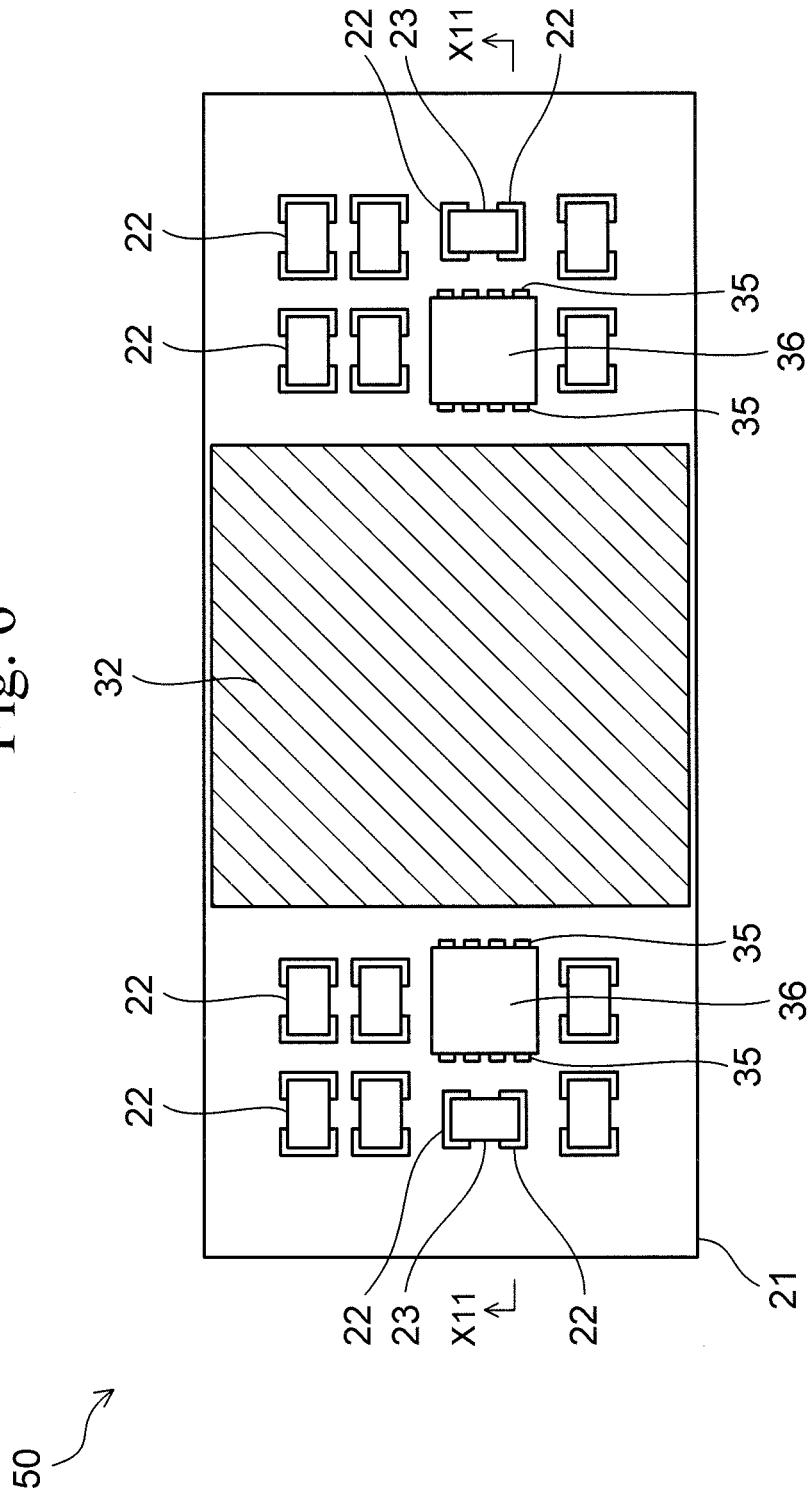
FIG. 6 is a plan view of a semiconductor device according to a modification of the embodiment.

FIG. 6 is a plan view of a semiconductor device according to a modification of the embodiment, and FIG. 7 is a cross-sectional view taken along line X11-X11 in FIG. 6.

As depicted in FIGS. 6 and 7, in a semiconductor device 50, the second heat sinks 42 are not provided, and the second elements 36 are therefore exposed. If the second elements 36 produce a small amount of heat, the semiconductor device 50 may have a structure to release heat from the second elements 36 directly to the air without the second heat sinks 42 provided therein.

Further, when warpage of the wiring substrate 21 is not problematic, the frame 32a of the first heat sink 32 functioning as a stiffener may be omitted, and the first heat sink 32 may be bonded to the wiring substrate 21 at its protrusions 32b (see FIG. 6), as depicted in the example in FIGS. 6 and 7.

All examples and conditional language recited herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A method for manufacturing a semiconductor device, comprising:
    mounting a first element on a wiring substrate;
    placing a first heat sink on the first element with a metal material interposed between the first heat sink and the first element;
    attaching the first heat sink to the first element via the metal material by heating and melting the metal material;
    mounting a second element on the wiring substrate after attaching the first heat sink to the first element; and
    attaching a second heat sink onto the second element via a resin material after mounting the second element on the wiring substrate.

2. The method for manufacturing a semiconductor device according to claim 1, wherein
    the resin material used in attaching the second heat sink onto the second element is a thermosetting material, and is cured by being heated at a temperature lower than a melting point of the metal material.

3. The method for manufacturing a semiconductor device according to claim 1, wherein
    the first heat sink includes a frame provided along an edge of the wiring substrate in a plan view, and
    the method further comprises:
    bonding the frame to the edge.

4. The method for manufacturing a semiconductor device according to claim 1, further comprising:
    forming a metal layer on the first element, before placing the first heat sink on the first element.

5. The method for manufacturing a semiconductor device according to claim 1, wherein
    the first heat sink includes a first surface beside the first element, and the first heat sink includes a protrusion that extends from the first surface to the wiring substrate.

6. The method for manufacturing a semiconductor device according to claim 5, wherein
    the protrusion is located between the first element and the second element in a plan view.

7. The method for manufacturing a semiconductor device according to claim 1, wherein
    the first element is a first active element, and
    the second element is a second active element.

8. The method for manufacturing a semiconductor device according to claim 7, wherein the first element is a processing unit, and
the second element is a regulator or a memory.

9. The method for manufacturing a semiconductor device according to claim 1, further comprising:
   connecting an electronic component to the wiring substrate via solder by heating and melting the solder, before mounting the second element.

10. The method for manufacturing a semiconductor device according to claim 1, further comprising:
    connecting an external connection terminal to the wiring substrate by heating and melting the external connection terminal, before mounting the second element.

11. The method for manufacturing a semiconductor device according to claim 1, further comprising:
    before mounting the first element on the wiring substrate, mounting a passive element on the wiring substrate.

* * * * *